United States Patent [19]
McClure et al.

[11] Patent Number: 5,424,988
[45] Date of Patent: Jun. 13, 1995

[54] STRESS TEST FOR MEMORY ARRAYS IN INTEGRATED CIRCUITS

[75] Inventors: David C. McClure, Carrollton; James Brady, Dallas, both of Tex.

[73] Assignee: SGS-Thomson Microelectronics, Inc., Carrollton, Tex.

[21] Appl. No.: 954,276

[22] Filed: Sep. 30, 1992

[51] Int. Cl.⁶ .............................................. G11C 7/00
[52] U.S. Cl. ..................... 365/201; 365/202
[58] Field of Search ............. 365/201, 189.09, 189.01, 365/202

[56] References Cited

U.S. PATENT DOCUMENTS

| | | | |
|---|---|---|---|
| 4,342,103 | 7/1982 | Higuchi | 365/201 |
| 4,651,304 | 3/1987 | Takata | 365/201 |
| 4,751,679 | 6/1988 | Dehganpour | 365/201 |
| 5,046,049 | 9/1991 | Choi | 365/201 |
| 5,086,413 | 2/1992 | Tsuboi | 365/201 |
| 5,208,228 | 5/1993 | Kumanoya | 365/201 |
| 5,258,954 | 11/1993 | Furuyama | 365/201 |
| 5,276,647 | 1/1994 | Matsui | 365/201 |

*Primary Examiner*—Joseph A. Popek
*Assistant Examiner*—A. Zarabian
*Attorney, Agent, or Firm*—Kenneth C. Hill; Robert Groover; Lisa K. Jorgenson

[57] ABSTRACT

A method for stress testing a memory array in an integrated circuit. Control circuitry selects a plurality of row lines at one time. An overvoltage suitable for stressing the cells of the array is placed on the bit lines. Because a block of cells has been selected, the overvoltage is applied to all cells of the block. The block of cells selected may be either the entire memory array or a portion of the memory array. The selected rows remain selected for the duration of the stress test. Because the overvoltage is applied directly to selected cells, the full overvoltage will be used to stress the transistor gates for the entire test period. In this manner, latent defects within the memory array can be detected.

33 Claims, 1 Drawing Sheet

STRESS TEST FOR MEMORY ARRAYS IN INTEGRATED CIRCUITS

BACKGROUND OF THE INVENTION

1. Field of the Invention

The present invention relates in general to integrated circuits, and more particularly to memory arrays in integrated circuits. Still more particularly, the present invention relates to a method for stress testing a memory array.

2. Description of the Prior Art

Stress testing of memory arrays is typically accomplished by applying an overvoltage to the gates of the transistors in the array. To perform this test, it is typical to apply the overvoltage to all of the bit and complementary bit lines, and then sequentially activate each word line in the memory. In this manner, a stress voltage is applied to every cell in the array.

This method of stress testing a memory array has several problems. First, the amount of time available to stress a memory cell is limited to the amount of time a word line is activated. As each of the word lines are sequentially activated, a memory cell is stressed for only the amount of time its corresponding word line is activated.

Second, if latent defects exist in the memory array, this method of stress testing may not detect all the defects. This is due to charge leakage through a marginal defect. Once the memory cell has stored the overvoltage, current leakage may occur and lower the voltage stored in the cell. Although some of the lost charge can be replaced by current flowing through the load element, the amount of replaced charge may be less than the charge lost. This is especially true in low power memory cells because the load resistor is very large, typically a teraohm, so very little current will flow through the resistor. Consequently, the voltage in the memory cell is not maintained at the stress level for the proper amount of time, and marginal cells may survive the stress test. This allows latent defects in the memory cell to go undetected, resulting in the production of marginal memory arrays.

Therefore, it would be desirable to provide a method for stress testing a memory array where the memory cells are maintained at the stress voltage level for the proper amount of time. It is also desirable that such a method not increase the complexity of the fabrication of integrated circuit.

SUMMARY OF THE INVENTION

A technique is provided for stress testing a memory array in an integrated circuit. Control circuitry selects a plurality of row lines at one time. An overvoltage suitable for stressing the cells of the array is placed on the bit lines. Because a block of cells has been selected, the overvoltage is applied to all cells of the block. The block of cells selected may be either the entire memory array or a portion of the memory array. The selected rows remain selected for the duration of the stress test. Because the overvoltage is applied directly to selected cells, the full overvoltage will be used to stress the transistor gates for the entire test period. In this manner, latent defects within the memory array can be detected.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
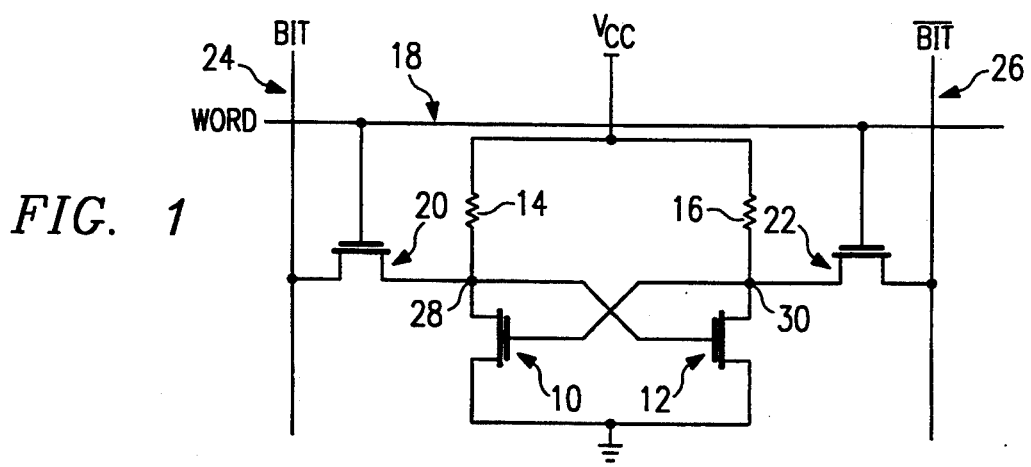
FIG. 1 is a circuit diagram illustrating a memory cell within a memory array.

Referring to FIG. 1, a circuit diagram of a memory cell is illustrated. As can be seen, a first transistor 10, a second transistor 12, a first load element 14, and a second load element 16 are arranged in a flip-flop configuration. In the preferred embodiment, load elements 14, 16 are resistors, but those skilled in the art will recognize that p-channel transistors may also be used for load elements 14, 16.

Row line 18, labeled word, is connected to the gate of a third transistor 20 and fourth transistor 22. Row line 18 is utilized to activate the cell. Signal lines 24, 26 labeled bit and bit bar, respectively, are then utilized to store data to and read data from the cell. In this manner, third and fourth transistors 20, 22 act as select transistors, and first transistor 10 and second transistor 12 are storage transistors.

Data is stored as voltage levels with the two sides of the flip-flop in opposite voltage configurations. The memory cell has two stable states, high or logic 1, and low or logic 0. If the memory cell is storing a logic 1, node 28 is high and node 30 is low, with first transistor 10 turned off and second transistor 12 turned on. The logic 0 state would be the opposite, with node 28 low and node 30 high.

Figure 2:
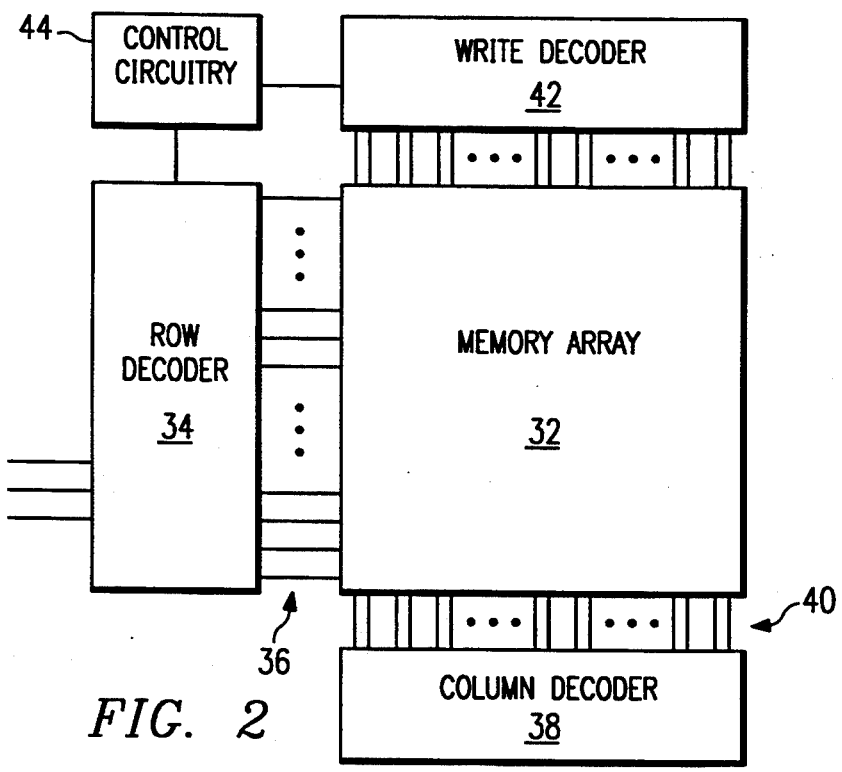
FIG. 2 is a block diagram illustrating a portion of the circuitry in a memory integrated circuit.

The memory cell illustrated in FIG. 1 is imbedded in an array of similar cells. FIG. 2 is a block diagram of the circuitry associated with a memory array in an integrated circuit according to the present invention. Memory array 32 is accessed by a row decoder 34 which selects a word line from a plurality of word lines 36. A column decoder 38 selects the appropriate bit and bit bar lines from a plurality of bit and bit bar lines 40. Write decoder 42 is utilized to write data into the memory array 32. Although column decoder 38 and write decoder 42 are depicted as separate circuits, those skilled in the art will recognize that column decoder 38 and write decoder 42 may be combined in one circuit.

As known in the prior art, stress testing of the memory array is accomplished by selecting one word line at a time within the memory array. An overvoltage, typically seven volts, is applied from $V_{cc}$ to all of the bit and complementary bit lines, while each word line in the memory is sequentially activated. In this manner, a stress voltage is applied to every cell in the array.

This method of stress testing may not detect all the defects which exist in the array. This is due to charge leakage through a marginal defect. For example, with reference to FIG. 1, a charge is stored in the memory cell at node 28. Current may leak through the gate of transistor 12 and lower the charge stored in the cell. Although some of the lost charge can be replaced by current flowing through the load element 14, the amount of replaced charge may be less than the charge lost. Consequently, the charge in the memory cell is not maintained at the stress level for the proper amount of time, and marginal cells may survive the stress test. This allows latent defects in the memory cell to go undetected, resulting in the production of marginal memory arrays.

A technique for stress testing a memory array according to the present invention will now be described. Referring now to FIG. 2, block 44 represents control circuitry which generates a control signal utilized by row decoder 34 and write decoder 42. The control signal from block 44 causes row decoder 34 to select all or a portion of the word lines at one time. The selected word lines remain activated for the duration of the stress test. The control signal from block 44 is also utilized by the write decoder 42 to set all or a portion of the bit lines in the array to a high voltage level, usually seven volts, and all or a portion of the bit line bars to a low voltage level. After a predetermined amount of time, the voltage levels are switched, with all the bit lines in the array set to a low voltage level and all the bit line bars set to a high voltage level. By applying the overvoltage through control circuitry 44 to bit lines and complementary bit lines, instead of from $V_{cc}$ through load elements 14, 16, the overvoltage level is maintained throughout the duration of the stress test and completely stresses first and second transistors 10, 12. By stress testing the memory array in the manner, latent defects within memory cells can be detected.

If current transients are a concern, it is possible to begin the stress test with $V_{cc}$ set at a low voltage level, and then ramp up $V_{cc}$ to a desired level. This would reduce current transients. Furthermore, alternative methods for stress testing the array could be utilized. In one alternative method, only portions of the array are selected and tested at one time. For example, some of the word lines may be selected at one time, perform the test on the memory cells associated with those word lines, and then select another group of word lines. This process continues until the entire array of memory cells has been tested. Depending on how the row decoder is set up, another alternative is to select the word lines in one quadrant of the array and test the quadrant, then move onto the next quadrant. This would also minimize current transients.

Figure 3:
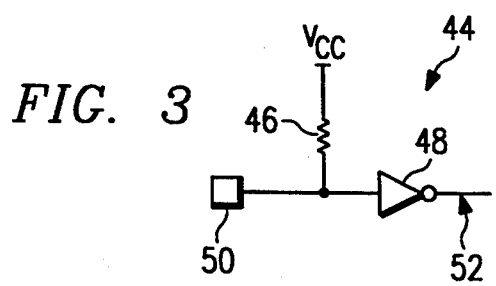
FIG. 3 is a circuit diagram illustrating a test mode pin circuit utilized in testing a memory array according to the present invention.

FIG. 3 is a circuit diagram illustrating a test mode pin circuit for stress testing a memory array according to the present invention. Resistor 46 is connected to $V_{cc}$ and is an input into inverter 48. Input pad 50 is also input into inverter 48. The test mode circuit 44 illustrated in FIG. 3 allows the memory array to be stress tested while at the wafer level of fabrication of an integrated circuit. A probe can ground input pad 50, causing the output line 52 of inverter 48 to go high. Output line 52 may be, for example, an additional input into a gate. A high voltage level on output 52 may be utilized to activate all of the word lines within the memory array at one time. It is possible, however, to utilize this method of stress testing a memory array at other steps along the fabrication process or once the memory array is packaged. For example, a test pin in the packaged integrated circuit may be utilized to stress test the memory array. Typically, the test mode can be entered using a selected over or under voltage, or a patterned input signal, as known in the art.

An alternative method for stress testing a memory array will now be described with reference to FIGS. 1–2. As described above, the control signal from block 44 causes row decoder 34 to select all or a portion of the word lines at one time. The selected word lines remain activated for the duration of the stress test. The control signal from block 44 is also utilized by the write decoder 42 to set all or a portion of the bit lines in the array to a high voltage level, usually seven volts, while voltage level on the bit line bars is allowed to float. The bit line bars will then be pulled to a low voltage by the memory cells. After a predetermined amount of time, the voltage levels are switched, with all the bit line bars set to a high voltage level and the bit lines floating. As before, the bit lines will be pulled low by the memory cells.

Furthermore, a method for stressing select transistors 20, 22 involves writing data into a memory cell, preferably at a high voltage. In a first part of the stress procedure, a one is written to each cell. This may be done for all cells simultaneously, or one row at a time. After writing the data, node 28 and signal line 24 are high, and node 30 signal line Z6 are low. The word line 18 is then not activated. The voltage levels on the bit lines and complementary bit lines are then switched, so that the data on the bit lines is complementary to that stored in the cells. This creates a voltage stress across the select transistors 20, 22, allowing marginal select transistors to be ferreted out. The procedure can be repeated using complementary data written into the memory cells, causing both select transistors 20, 22 to be stressed in both directions.

Those skilled in the art will recognize that the invention provides a method for stress testing a memory array which maintains an overvoltage on the memory cells so that latent defects within the array are detected. Furthermore, the stress test described above does not significantly increase the complexity of the fabrication process.

While the invention has been particularly shown and described with reference to a preferred embodiment, it will be understood by those skilled in the art that various changes in form and detail may be made therein without departing from the spirit and scope of the invention.

What is claimed is:

1. A method for testing an array of memory cells in an integrated circuit, each said cell being connected to a complementary pair of bitlines, comprising the steps of:
    a.) selecting a plurality of row lines simultaneously, such that multiple rows of said array of memory cells are selected; and
    b.) applying a stress voltage, which is never applied under normal operating conditions, to a plurality of said bitlines of the array of memory cells for a predetermined time period, without simultaneously applying the stress voltage to bitlines of the same complementary pair; and wherein step b) further comprises the steps of
        i.) setting a plurality of first bit lines of said array to an overvoltage level, which is greater than any normal operating voltage of said array, for a predetermined time period; and
        ii.) setting a plurality of second bit lines of said array, which are each complementary to a respective one of said first bit lines, to the overvoltage level for a predetermined time period.

2. The method of claim 1, further comprising the steps of:

setting the plurality of second bit lines to a low voltage while said first bit lines are each set to said overvoltage level; and setting the plurality of first bit lines to a low voltage while said second bit lines are set to said overvoltage level.

3. The method of claim 1, further comprising the steps of:

letting the plurality of second bit lines float while the plurality of bit lines are set to said overvoltage level; and letting the plurality of first bit lines float while the plurality of second bit lines are set to said overvoltage level.

4. The method of claim 1, wherein said step of selecting the plurality of row lines simultaneously comprises selecting all of the row lines in the array of memory cells simultaneously.

5. The method of claim 1, wherein the selected plurality of row lines is less than all of the row lines in the array of memory cells in the integrated circuit.

6. The method of claim 5, wherein said stress voltage is applied to only a selected portion of the array of memory cells.

7. The method of claim 1, wherein said predetermined time period extends for the entire duration of stress testing said array.

8. The method of claim 1, wherein said step of setting the plurality of first bit lines to the overvoltage level for the predetermined time period comprises setting a portion of the bit lines in the array of memory cells to the overvoltage level for the duration of a testing time period.

9. The method of claim 1, wherein said step of setting the plurality of second bit lines to the overvoltage voltage level for the predetermined time period comprises setting all of the second bit lines to the overvoltage level for the duration of a testing time period.

10. A method for testing an array of memory cells, comprising the steps of .

selecting a plurality of row lines simultaneously for a testing period;

setting a plurality of first bit lines to an overvoltage level, which is greater than any normal operating voltage of said array, for a predetermined time period; and setting a plurality of second bit lines of said array, which are each complementary to a respective one of said first bit lines, to the overvoltage level for a predetermined time period.

11. The method of claim 10, further comprising the steps of:

setting said plurality of second bit lines to a low voltage while the plurality of first bit lines are each set to said overvoltage level; and setting the plurality of first bit lines to a low voltage while said second bit lines are set to the high voltage.

12. The method of claim 10, further comprising the steps of:

letting said second bit lines float while said first bit lines are set to said overvoltage level; and letting said first bit lines float while said second bit lines are set to said overvoltage level.

13. The method of claim 10, wherein said step of selecting the plurality of row lines simultaneously for the testing period comprises selecting all of the row lines in the array of memory cells for the testing period.

14. The method of claim 10, wherein the selected plurality of row lines is less than all of row lines in the array of memory cells in the integrated circuit.

15. The method of claim 10, wherein said step of setting said first bit lines to the overvoltage level for the predetermined time period comprises setting all of the first bit lines in the array of memory cells to the overvoltage level for the predetermined time period.

16. The method claim 10, wherein said step of setting said second bit lines to the overvoltage level comprises setting all of the second bit lines to the overvoltage level for the predetermined time period.

17. A method for testing an array of memory cells, each said cell being connected to a bit line and a complementary bit line, comprising the steps of:

writing data into said array of memory cells, to set one or more of said bit lines to a first voltage, which is greater than any applied under normal operating conditions, and respective one or more of said complementary bit lines to the complement of said first voltage; and while retaining said data in said array of cells, setting one or more of said complementary bit lines to said first voltage and respective one or more of said bit lines to the complement of said first voltage for a predetermined time period; whereby memory cells having leaky pass transistors can be detected.

18. A memory in an integrated circuit, comprising:

a row decoder;

a column decoder;

a memory array comprising a plurality of memory cells, each of said cells being connected to an associated bitline and an associated complementary biline, wherein said row decoder and said column decoder are utilized to access said memory array; and a control circuit, wherein said control circuit is connected to selectably place the plurality of said memory cells into a test mode such that an overvoltage, which is outside the normal range of operating voltages of said cells, is first applied to said associated bilines and then to said associated complementary bitlines of said memory array in order to stress test the memory array.

19. The method of claim 1, wherein said step of applying a voltage stress is performed in response to an input received from a probe.

20. The method of claim 1, wherein said memory cells consist of static RAM cells.

21. The method of claim 1, wherein said memory cells consist of 4-transistor static RAM cells.

22. The method of claim 1, wherein said overvoltage level is in the neighborhood of 7 volts.

23. The method of claim 10, wherein said steps of applying overvoltage levels are performed in response, to an input received from a probe.

24. The method of claim 10, wherein said memory cells consist of static RAM cells.

25. The method of claim 10, wherein said memory cells consist of 4-transistor static RAM cells.

26. The method of claim 10, wherein said overvoltage level is in the neighborhood of 7 volts.

27. The method of claim 10, Wherein said memory cells consist of static RAM cells.

28. The method of claim 17, wherein said memory cells consist of 4-transistor static RAM cells.

29. The method of claim 17, wherein said memory cells consist of static RAM cells.

30. The method of claim 17, wherein said complementary voltage levels are never applied under normal operating conditions.

31. The integrated circuit memory of claim 18, wherein said control circuitry forces said address decoder circuitry to access a large number of said memory cells simultaneously only if a predetermined signal is received on a probe pad which is not connected to any bond wire.

32. A low-power integrated circuit memory, comprising:

an array of memory cells, each comprising a latch and each of said cells being connected to a complementary pair of bitlines;

address decoder circuitry, connected to access selected ones of said memory cells in accordance with externally received addresses, and additional circuitry connected to provide data input and output to a selected one of said memory cells;

control circuitry, connected to force said address decoder circuitry to access a large number of said memory cells simultaneously, and to hold said memory cells in an accessed state while an overvoltage, which is outside the normal range of operating voltages of said cells, is applied to each of said accessed cells, without simultaneously applying the overvoltage to bitlines of the same complementary pair.

33. The integrated circuit memory of claim 32, wherein said control circuitry forces said address decoder circuitry to access a large number of said memory cells simultaneously only if a predetermined signal is received on a probe pad which is not connected to any bond wire.

* * * * *